(12) United States Patent
Mos et al.

(10) Patent No.: US 8,248,579 B2
(45) Date of Patent: Aug. 21, 2012

(54) LITHOGRAPHIC APPARATUS, DEVICE MANUFACTURING METHOD AND DEVICE FOR CORRECTING OVERLAY ERRORS BETWEEN OVERLAPPING PATTERNS

(75) Inventors: Everhardus Cornelis Mos, Best (NL); Maurits Van Der Schaar, Eindhoven (NL); Hubertus Johannes Gertrudus Simons, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 403 days.

(21) Appl. No.: 11/948,801

(22) Filed: Nov. 30, 2007

(65) Prior Publication Data

US 2008/0165332 A1 Jul. 10, 2008

Related U.S. Application Data

(63) Continuation-in-part of application No. 11/607,098, filed on Dec. 1, 2006, now Pat. No. 7,683,351.

(51) Int. Cl.
*G03B 27/68* (2006.01)

(52) U.S. Cl. ........................................... 355/52

(58) Field of Classification Search ................ 355/52, 355/53; 430/22, 30
See application file for complete search history.

(56) References Cited

U.S. PATENT DOCUMENTS

| | | | |
|---|---|---|---|
| 4,332,473 A | 6/1982 | Ono | |
| 6,317,211 B1 | 11/2001 | Ausschnitt et al. | |
| 6,440,612 B1 | 8/2002 | Baggenstoss | |
| 6,753,948 B2 * | 6/2004 | Taniguchi | 355/71 |
| 7,683,351 B2 | 3/2010 | Mos et al. | |
| 2003/0035090 A1 | 2/2003 | Imai et al. | |
| 2003/0042579 A1 | 3/2003 | Schulz | |
| 2006/0132807 A1 | 6/2006 | Abdulhalim et al. | |
| 2006/0238761 A1 | 10/2006 | Lin et al. | |
| 2008/0128642 A1 | 6/2008 | Mos et al. | |
| 2008/0130982 A1 | 6/2008 | Kitamura et al. | |
| 2008/0259297 A1 | 10/2008 | Kawakubo | |

FOREIGN PATENT DOCUMENTS

EP 1 628 164 A2 2/2006
(Continued)

OTHER PUBLICATIONS

U.S. Appl. No. 12/516,909, filed May 2009, Mos et al.*

(Continued)

*Primary Examiner* — Peter B Kim
*Assistant Examiner* — Chia-how Michael Liu
(74) *Attorney, Agent, or Firm* — Sterne, Kessler, Goldstein & Fox P.L.L.C.

(57) ABSTRACT

A lithographic apparatus includes an illumination system configured to condition a radiation beam, a support for a patterning device, a substrate table for a substrate, a projection system, and a control system. The patterning device is capable of imparting the radiation beam with a pattern in its cross-section to form a patterned radiation beam. The projection system is configured to project the patterned radiation beam as an image onto a target portion of the substrate along a scan path. The scan path is defined by a trajectory in a scanning direction of an exposure field of the lithographic apparatus. The control system is coupled to the support, the substrate table and the projection system for controlling an action of the support, the substrate table and the projection system, respectively. The control system is configured to correct a local distortion of the image in a region along the scan path by a temporal adjustment of the image in that region.

21 Claims, 5 Drawing Sheets

FOREIGN PATENT DOCUMENTS

| | | |
|---|---|---|
| JP | 06-310399 A | 11/1994 |
| JP | 07-057991 | 3/1995 |
| JP | 09-162106 A | 6/1997 |
| JP | 2000-036451 A | 2/2000 |
| JP | 2001-028323 A | 1/2001 |
| JP | 2001-338860 A | 12/2001 |
| WO | WO 2006/126569 | 11/2006 |

OTHER PUBLICATIONS

International Search Report and Written Opinion for Application No. PCT/NL2007/000298 mailed Jul. 4, 2008, 13 pgs.

Omori et al., "Progress in Proximity Electron Lithography: Demonstration of Print and Overlay Performance Using the Low-Energy Electron Beam Proximity-Projection Lithography [beta] tool", Journal of Microlithography, Microfabrication, and Microsystems, SPIE-Int. Soc. Opt. Eng USA, vol. 3, No. 3, Jul. 2004, pp. 402-412.

Seong-Yong Moon et al., "Analysis of photomask distortion caused by blank materials and open ratios", to appear in the Proceedings of the 20$^{th}$ Annual BACUS Symposium on Photomask Technology and Management, 2001, SPIE vol. 4186.

Non-Final Rejection mailed Jan. 27, 2009 for U.S. Appl. No. 11/607,098, filed Dec. 1, 2006, 8 pgs.

Final Rejection mailed Jul. 10, 2009 for U.S. Appl. No. 11/607,098, 5 pgs.

Mos et al., "Process, Apparatus and Device", U.S. Appl. No. 12/516,909, filed May 29, 2009.

Kikuchi, Takahisa et al., "Introduction of New Techniques for Matching Overlay Enhancement", *Optical Microlithography XIV*, 2001, pp. 1608-1616, vol. 4346, Proceedings of SPIE.

Notice of Allowance mailed Nov. 4, 2009 for U.S. Appl. No. 11/607,098, 7 pgs.

Office Action mailed on Jul. 28, 2010 for U.S. Appl. No. 12/516,909; 14 pages.

Office Action mailed on Nov. 24, 2010 for U.S. Appl. No. 12/516,909; 13 pages.

English language Abstract for JP 06-310399 A, published Nov. 4, 1994; 1 page.

English language Abstract for JP 07-057991, published Mar. 3, 1995; 1 page.

English language Abstract for JP 09-162106 A, published Jun. 20, 1997; 1 page.

English language Abstract for JP 2000-036451 A, published Feb. 2, 2000; 1 page.

English language Abstract for JP 2001-028323 A, published Jan. 30, 2001; 1 page.

English language Abstract for JP 2001-338860, published Dec. 7, 2001; 1 page.

English translation of Japanese Notice of Reasons for Rejection dated Oct. 29, 2010, directed to related Japanese Patent Application No. 2007-310091, Japan Patent Office; 8 pages.

English translation of Singapore Search and Examination Report dated Nov. 18, 2010, directed to related Singapore Patent Application No. 200718204-1, Intellectual Property Office of Singapore;15 pages.

U.S. Non Final Office Action directed to related U.S. Appl. No. 12/516,909, filed Dec. 14, 2009, mailed May 16, 2011; 17 pages.

* cited by examiner

LITHOGRAPHIC APPARATUS, DEVICE MANUFACTURING METHOD AND DEVICE FOR CORRECTING OVERLAY ERRORS BETWEEN OVERLAPPING PATTERNS

PRIORITY INFORMATION

This application is a continuation-in-part of U.S. patent application 11/607,098, filed Dec. 1, 2006 (that issued as U.S. Pat. No. 7,683,351 on Mar. 23. 2010), which is hereby incorporated by reference in its entirety.

FIELD OF THE INVENTION

The present invention relates generally to a lithographic apparatus, a method of manufacturing a device and a device made thereby.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

A mask is typically fabricated by electron beam lithography, in which a desired mask pattern is created on a photo-sensitive layer on the mask by means of controlled exposure of that layer to the electron beam (e-beam writing process). The pattern in the photosensitive layer is then transferred in a mask pattern layer which is typically a metal layer arranged on a transparent mask base layer.

It is known that due to the lithographic process the created mask pattern layer may exhibit some distortions or defects. Typical causes of defects are, for example, stress induced distortion (of the mask pattern layer), heating induced distortion during the e-beam writing process or distortions caused by a pellicle that is placed over the mask.

The creation of the IC involves the creation of a number of patterns overlaying each other in the target portion. The patterns overlaying each other typically have been created with different mask patterns each on a different mask. The mask patterns each have their own distortions or defects. During a transfer of the mask patterns to the target portion, the distortions will be transferred along with the mask patterns into the pattern created on the target portion. The overlaying patterns on the target portions therefore are typically associated with different distortions contributing to overlay errors within the target portion. Such overlay errors are often referred to as intra-field overlay errors.

SUMMARY

It is desirable to have a system and method which are capable of reducing or correcting the contribution of mask pattern distortions or defects to distortions of exposed patterns.

According to an aspect of the invention, there is provided a process for creating overlapping patterns on a target field of a substrate including providing overlay errors between the overlapping patterns, the provided overlay errors corresponding to controlling the process according to a suggested value for each of at least one process parameters of a model of the process, determining a value for each of the at least one process parameters corresponding to minimal overlay errors by fitting the model to data comprising the provided overlay errors and the suggested values for each of the at least one process parameters, creating the overlapping patterns thereby controlling the process according to the determined values for each of the at least one the process parameters and creating a first part of one of the overlapping patterns according to a first determined value for each of the at least one process parameters and creating a second part of the one of the overlapping patterns according to a second determined value for each of the at least one the process parameters wherein the first value differs from the second value.

According to an aspect of the invention, there is provided an apparatus for creating a first pattern of several overlapping patterns on a substrate comprising a substrate table to hold the substrate, and including a patterning device to create a first part of a first pattern in a first section of a target field and to create a second part of the first pattern in a second section of the target field, wherein the first part differs from the second part and the first section differs from the second section, controller connected to the patterning device and the substrate table and arranged to control the overlay between the first pattern and a second pattern of the several overlapping patterns by controlling the substrate table and the patterning device based on values of a group of process parameters, wherein the apparatus is arranged to create the first part according to a first value of a first process parameter of the group of process parameters and to create the second part according to a second value of the first process parameter.

An aspect of embodiments of the invention includes devices manufactured by the methods described herein.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
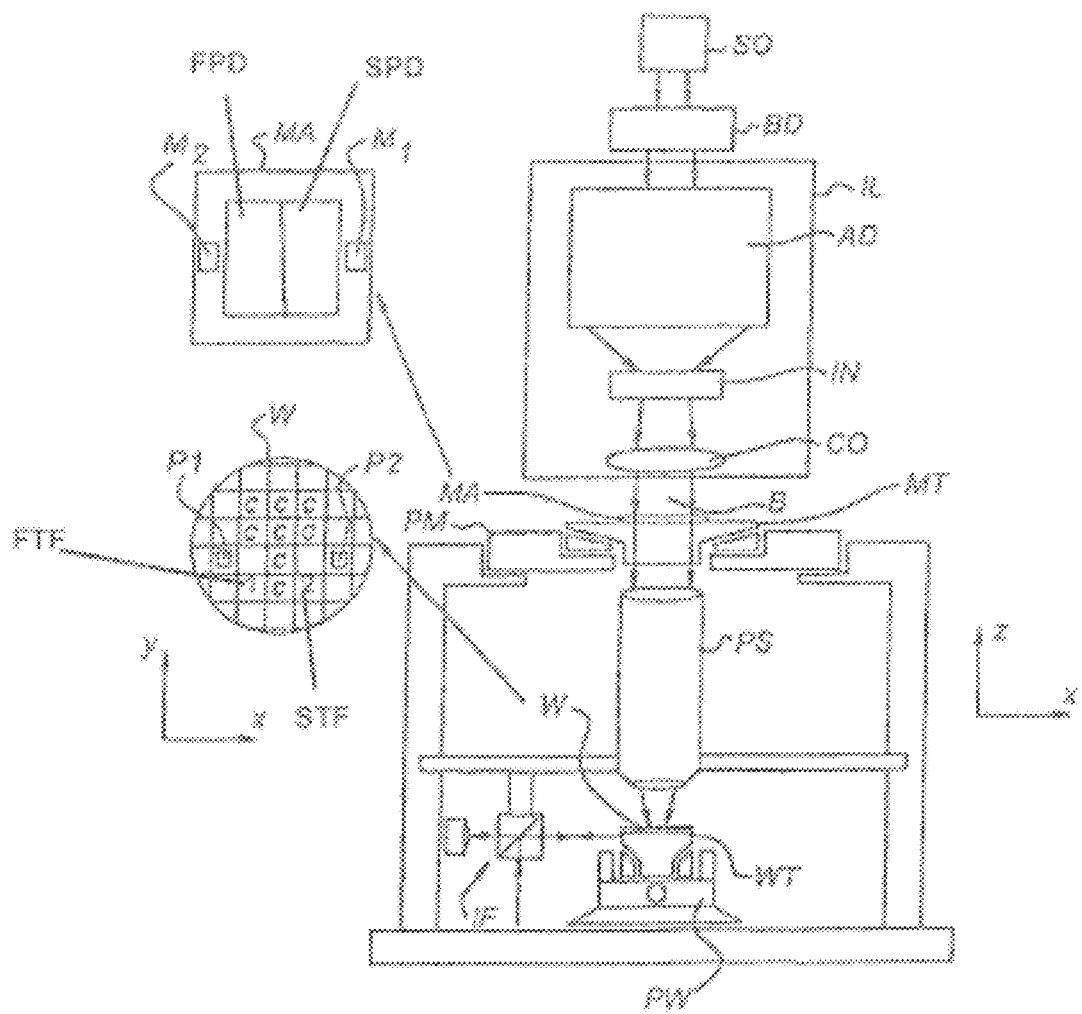
FIG. 1 depicts a lithographic apparatus according to an embodiment of the invention.

FIG. 1 schematically depicts a lithographic apparatus. The apparatus includes:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device".

The term "patterning device" used herein should be broadly interpreted as referring to any device that can be used to impart a radiation beam with a pattern in its cross-section such as to create a pattern in a target portion of the substrate. Furthermore, "patterning module" may broadly include the illumination and/or projection system in that those components contribute to creating the pattern that is projected onto the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more mask tables). In such "multiple stage" machines, the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as a-outer and a-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA (e.g., a first FPD and second SPD patterning device sections of mask MA), the mask alignment marks may be located between the dies.

The depicted apparatus could be used in at least one of the following modes to expose at least a first section FTF and a second section STF of the target field:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field (or scan field) limits the width (in the non-scanning direction) of the target portion in a single dynamic exposure, whereas the length of the scanning motion determines the height (in the scanning direction) of the target portion.

In mixed mode, a programmable patterning device is kept essentially stationary, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes a programmable patterning device, such as a programmable mirror array of a type as referred to above.

There are also known lithographic apparatus comprising a programmable patterning device, laid out so that the programmable patterning device and the target portion are scanned with respect to each other. This is be achieved by various combinations of a scanning or essentially stationary programmable patterning device and a scanning or substantially stationary substrate table. Where the programmable patterning device is kept essentially stable, it is supported by a support structure without the need for a first positioner PM configured to accurately position the patterning device in accordance with certain parameters.

Figure 2:
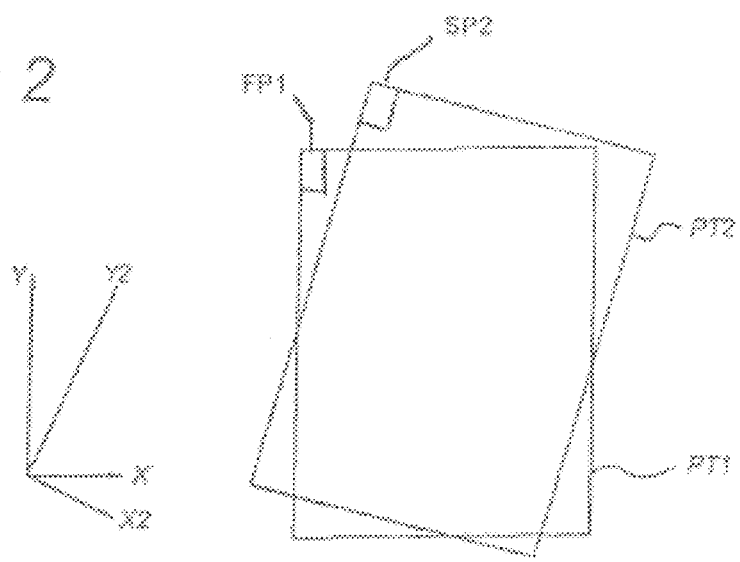
FIG. 2 depicts an overlay of a first mask pattern and a second mask pattern on a target portion.

The overlay between a first pattern PT1 and a second pattern PT2 in a target portion of a substrate is depicted in FIG. 2. The second pattern can be created on the substrate earlier than the first pattern. Each of patterns PT1 and PT2 may be thought of as a plurality of smaller pattern parts (e.g., at least a first pattern part FP1 and a second pattern part SP2).

The first pattern PT1 and the second pattern PT2 have been created on the substrate using a known process comprising:
  providing a photosensitive layer on the substrate
  scanning a patterning device with respect to a projection system thereby patterning a radiation beam
  creating a first image of the patterning device in a slit
  scanning the target field with respect to the slit thereby exposing the photosensitive layer of the substrate to the image and thereby creating the first pattern PT1

The image created in the slit is usually a factor (here called an image demagnification factor) 4 or 5 smaller than the original so as to be able to produce patterns with very small details without having to produce the details on the patterning device in the same scale.

Figure 3:
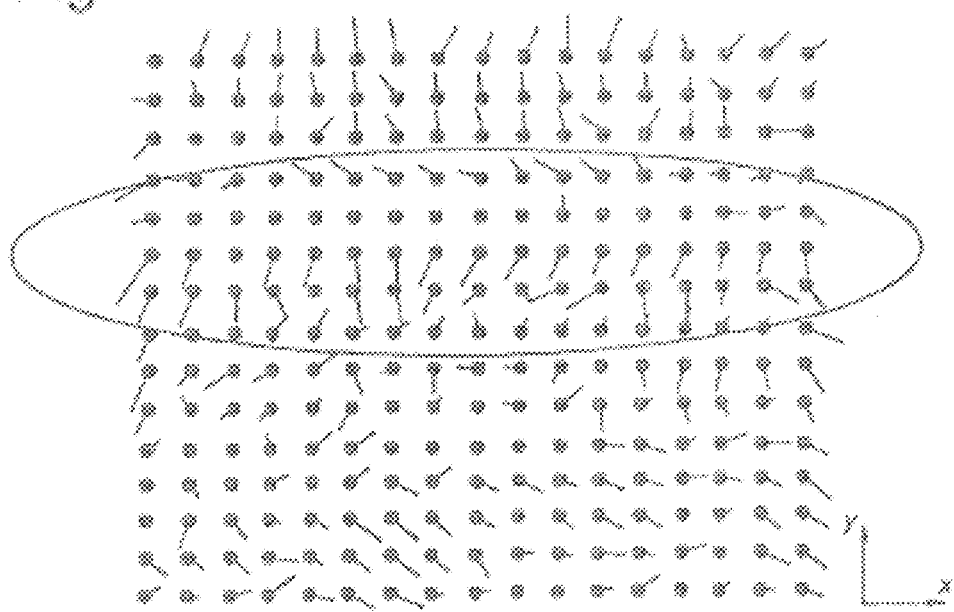
FIG. 3 depicts an example of residual mask pattern distortion.

FIG. 3 depicts an example of a residual overlay error map of the first and second patterns PT1, PT2 after overall corrections for translation, rotation and scaling.

Within the overlay error map, local overlay errors are shown. The local overlay errors relate to residual overlay errors after overall correction by the correction model, in this case the 6-parameter overlay correction model.

The local overlay errors are depicted as vector-lines of which the length relates to the magnitude of the overlay error and of which the direction relates to the direction of the overlay error.

Within the elliptical area, a relatively abrupt change of the local overlay error is visible.

In an embodiment of the present invention an intra-field correction is provided during the illumination of the second pattern PT2 for a given local residual overlay error. As explained such local residual overlay error may be due to mask distortion. The intra-field correction is superimposed as a dynamic (temporal) correction on any overall correction provided by the 6-parameter overlay correction model.

In an embodiment the intra-field correction comprises a first set of corrections which relate to dynamic/temporal adjustments of projection system parameters (or lens parameters), and a second set of corrections which relate to dynamic/temporal adjustments of scan parameters during the scan of the second pattern PT2. The dynamic adjustments of the scan parameters are superimposed on the overall scan parameters set in accordance with the 6-parameter overlay correction model to provide an overall correction of the scan of the second pattern PT2 relative to the first pattern PT1. The first set of corrections and the second set of corrections are applied in parallel to obtain minimal overlay errors.

Figure 4A:
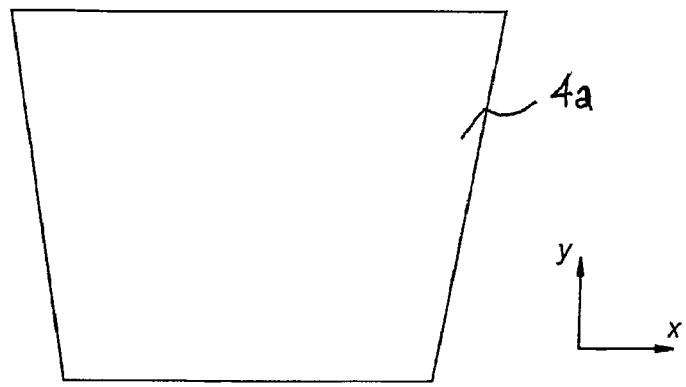
FIGS. 4a, 4b, 4c depict a first set of corrections for mask pattern distortion-related intra-field overlay error.
Figure 4B:
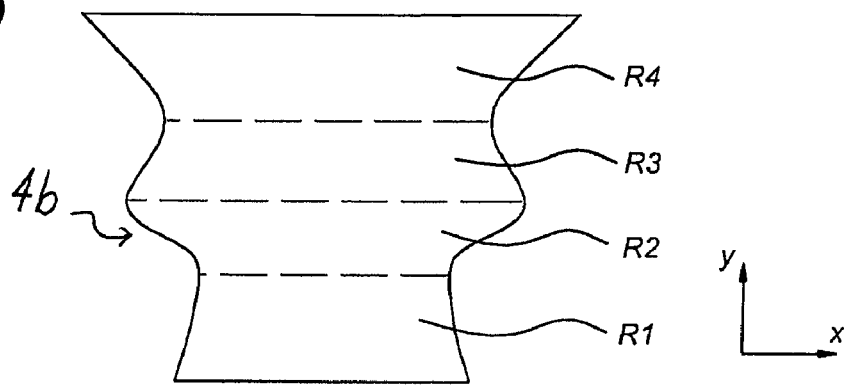
Figure 4C:
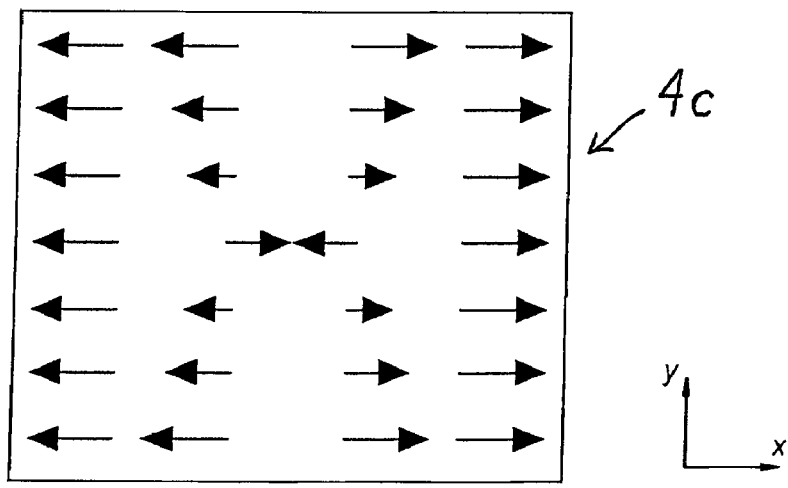

A first set of corrections according to an embodiment of the present invention is depicted in FIGS. 4a, 4b, 4c depict a first set of corrections for intra-field overlay error for instance caused by mask pattern distortion. Lens parameters can be used to adjust the lens magnification and third order lens aberrations. Possibly other lens aberrations are also adjustable for use as correction, but this may depend on the design of the projection lens system and the availability of suitable actuators for actuating the lens to correct such other lens aberration. While a scan is performed, the lens magnification can be varied along a scan path in the Y direction, i.e. a trajectory that is traversed during the exposure scan.

A first type of lens parameter correction according to the present invention, is a linear variation of the lens magnification in the X-direction (which is perpendicular to the scanning direction Y).

As is well known in the art, although the term lens magnification is frequently used, usually the image is shrunk. For that reason alternatively the term image shrink factor could be used.

The first type is schematically depicted in FIG. 4a as trapezoid area 4a, which is related to the scan field and its local magnification.

At the lower region of the scan field (for example, the begin of the scan), the magnification in the X-direction is relatively small. At the upper region of the scan field, the magnification is different, in this example relatively larger. By the first type of lens parameter correction, the magnification of the pattern (in the X-direction) varies linearly during the scan.

A second type of lens parameter correction according to the present invention, is a non-linear variation of the magnification in the X-direction. The second type is schematically depicted in FIG. 4b as a variable area 4b.

An example of a non-linear variation is illustrated in FIG. 4b. At a lower region R1 of the variable area 4b, the lens magnification in the X direction reduces during the scan (illustrated by a first convergence of the left and right boundaries of the area 4b). At a next region R2, the lens magnification in the X direction increases (illustrated by a first divergence of the left and right boundaries of the area 4b). At a further region R3, the lens magnification in the X direction reduces again (illustrated by a second convergence of the left and right boundaries of the area 4b). Finally, in a still further region R4, the lens magnification in the X direction increases again (illustrated by a second divergence of the left and right boundaries of the area 4b).

A third type of lens parameter correction according to the present invention, is a variation of the third order lens aberration correction in the X-direction. The third type is schematically depicted in FIG. 4c as a scan field area 4c.

The lens magnification in the X-direction is constant, which results in a rectangular scan field. Within the scan field, the third order lens aberration correction can be varied along the Y-direction. This variation is illustrated by means of arrows directed in the X-direction. The length of the arrows varies as a function of the position in the Y-direction to illustrate the variation of the third order lens aberration in the Y-direction.

By varying the magnification in the X-direction or the third order lens aberration correction from one region in the scan field to another, a dimension (parallel to the X-direction) of a feature of a pattern within the one region can be adjusted relative to another feature of the pattern in the other region.

It should be noted that FIGS. 4a, 4b, and 4c illustrate examples of variations of lens parameters. Variation of lens parameters according to the present invention is not limited to these examples.

Figure 5A:
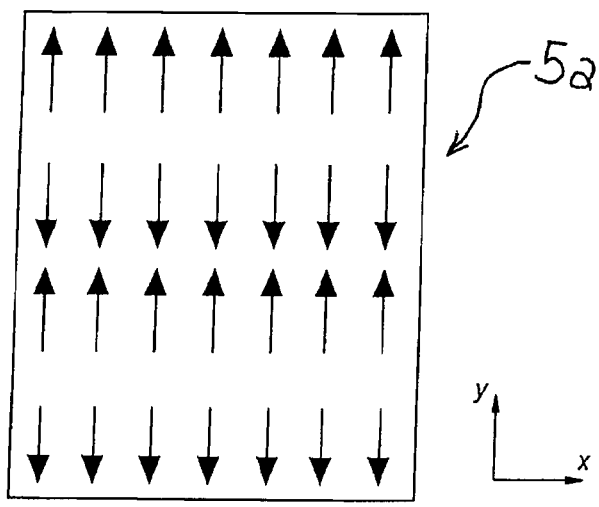
FIGS. 5a, 5b, 5c depict a second set of corrections for mask pattern distortion-related intra-field overlay error.
Figure 5B:
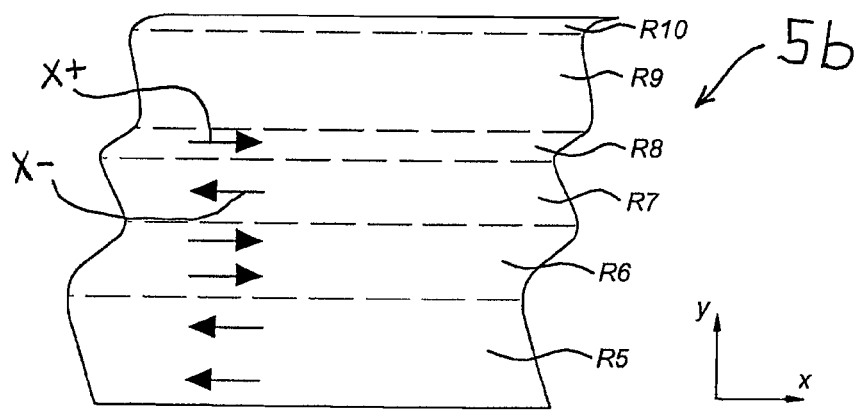
Figure 5C:
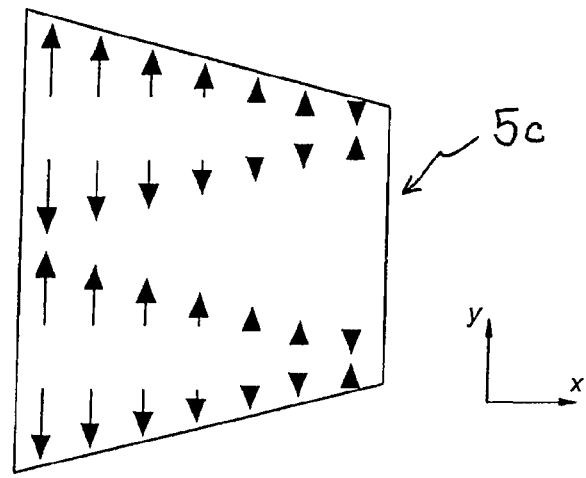

A second set of corrections according to an embodiment of the present invention is depicted in FIGS. 5a, 5b, and 5c.

The second set of corrections relates to dynamic adjustments of scan parameters superimposed on the overall scan parameters set in accordance with the 6-parameter overlay correction model to provide an overall correction of the scan of the second pattern PT2 relative to the first pattern PT1.

By using these dynamic adjustments of scan parameters, a variation of the magnification of the pattern in the Y-direction, a variation of translation and a variation of rotation can be achieved as explained below.

In an embodiment a variation of the magnification in the Y-direction in a scan field 5a is implemented by a variation of a scan speed between the mask stage and the wafer stage in the Y-direction (FIG. 5a). In the embodiment some regions correspond to deceleration (regions with arrows pointing downward) and some regions correspond to an acceleration (regions with arrows pointing upward) of the scan speed. By varying the scan speed between the mask stage and the wafer stage from one region in the scan field to another, a dimension (parallel to the Y-direction) of a feature of a pattern within the one region can be adjusted relative to another feature of the pattern in the other region. It is noted that this dimension is adjusted without the need for changing the image demagnification factor.

In a further embodiment a variation of the translation in the X-direction is implemented as a function of the scan path for scan field 5b (FIG. 5b).

The translation in the X-direction can be varied along the X-direction in one direction (indicated by arrow X+) or the opposite direction (indicated by arrow X−). The translation directions are shown within the scan field.

In the embodiment (FIG. 5b), in a lower region R5 translation is carried out in the direction X−. In a next region R6, translation in the other direction X+ is performed. In a further region R7, translation is carried out again in the direction X−. In subsequent region R8, translations are again directed in the direction X+. In a next region R9, translations are substantially zero. In a final region R10, a translation is carried out in the direction X+.

By varying the translation from one region in the scan field to another, a position of a feature of a pattern within the one region can be adjusted relative to a position of another feature of the pattern in the other region.

In a further embodiment a variation of the rotation is implemented as a function of the scan path for scan field 5c (FIG. 5c).

Within the scan field 5c there are regions having a sense of rotation in one direction (regions with arrows pointing downward) or an opposite sense of rotation (regions with arrows pointing upward). The length of the arrows in a region indicates a distance of the arrow from a center of rotation in that region.

By varying the sense of rotation from one region in the scan field to another, an orientation of a feature of a pattern within the one region can be adjusted relative to an orientation of another feature of the pattern in the other region.

The dynamic adjustments of lens parameters and scan parameters according to the method of the present invention while executing a scan as illustrated above, are determined from a residual mask distortion for the overlay of a first pattern PT1 and second pattern PT2. The residual local distortion of the mask may be derived from measurement of an overlay pattern created on a semiconductor substrate, but additionally or alternatively from distortion measurements on the first and/or second mask pattern. The procedures for determining residual local distortion are known to the skilled person.

Corrections by the known 6-parameter overlay correction model can be taken into account when determining the residual local mask distortion.

In an embodiment of the invention, after determination of the residual local distortion, which can be represented by a residual distortion map, the appropriate adjustments of lens parameters and scan parameters is determined. Due to the projection characteristics of a scan (i.e. projecting a series of line-shaped patterns parallel to the X-direction in a sequence along the scan path in the Y-direction), the dynamic adjustments are determined so as to minimize the residual distortions in both the X-direction and the Y-direction for each point along the scan path in the Y-direction.

In an embodiment of the invention the local distortion is determined from distortion measurement on a distorted mask pattern, and the pattern image is corrected during exposure.

The adjustments of lens parameters and scan parameters as required to minimize the residual distortions can be any combination of the adjustments of one or more lens parameters and one or more scan parameters as described with reference to FIGS. 4a-4c and 5a-5c.

In one embodiment, the pattern image relates to the pattern image of a single mask pattern. In another embodiment, the pattern image relates to an overlay between the first pattern and the second pattern.

Figure 6:
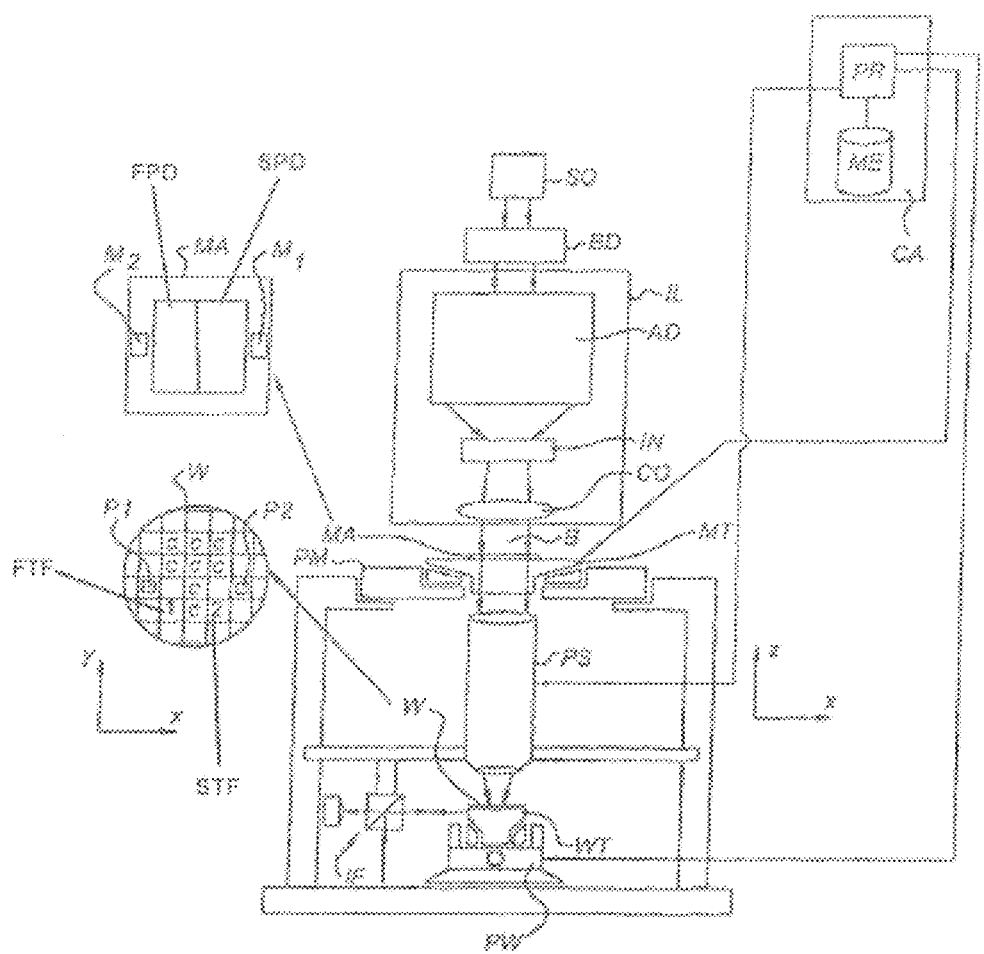
FIG. 6 depicts a lithographic apparatus comprising a computer system arranged for performing a method in accordance with the present invention.

FIG. 6 depicts a lithographic apparatus comprising a computer system CA arranged for performing a method in accordance with the present invention.

In FIG. 6, entities with the same reference number as shown in the preceding figures refer to the corresponding entities in the preceding figures.

To control adjustments of lens parameters and scan parameters during scanning, a lithographic apparatus is equipped with a control system that is capable of controlling the required adjustments for each point along the scan path.

Typically, such a control system includes a computer system CA comprising a processor PR for performing arithmetical operations, and a memory ME. This is schematically depicted in FIG. 6, showing an example of a lithographic apparatus, similar to the lithographic apparatus as shown in FIG. 1, now further comprising the processor PR which is arranged to communicate with memory ME or some other form of machine-readable medium or media. Memory ME may be any type of memory arranged to store instructions and data, such as a tape unit, a hard disk, Read Only Memory (ROM), Non-Volatile Random Access Memory (NVRAM) and Random Access Memory (RAM).

The processor PR may be arranged to read and execute one or more programs stored in memory ME providing the processor PR with the functionality to perform the method for adjustments described above. In order to be able to perform these methods, the processor PR is arranged to determine and control a position of the mask table MT, a position of the substrate table WT, and/or parameters of the projecting system PS (lens system), and possibly further components of the lithographic apparatus. The processor PR may be specially equipped or configured to perform the described embodiment of the method, but may also be a central processor arranged to control the lithographic apparatus as a whole and now being provided with additional functionality to perform the described implementation or embodiment of the method, or other implementations of the method.

It should be understood that there may be provided more and/or other units, such as memory units, input devices and read devices known to persons skilled in the art. Moreover, one or more of them may be physically located remotely from the processor PR, if required. The processor PR is shown as one box, however, it may comprise several processing units functioning in parallel or controlled by one main processor PR that may be located remotely from one another, as is known to persons skilled in the art.

Although all connections in FIG. 6 are shown as physical connections, one or more of these connections can be made wireless. They are only intended to show that "connected" units are arranged to communicate with one another in some way. The computer system can be any signal processing system with analog and/or digital and/or software technology arranged to perform the functions discussed here.

The computer system can also be configured to determine residual distortions of an overlay between the first pattern PT1 and the second pattern PT2 in a residual distortion map.

The overlay data relating to the overlay between the first pattern PT1 and the second pattern PT2 may be obtained from a metrology tool that measures the intra-field local overlay of the first and second patterns PT1,PT2. Alternatively, the overlay data may be obtained from distortion measurements of the first and second mask patterns. In addition, in an embodiment of the invention, the process parameters (i.e. scan parameters and/or lens parameters) are determined in the metrology tool or a stand alone tool. In the embodiment, the process parameters are then fed to for instance a lithographic apparatus operating in scan mode or in mixed mode or a lithographic apparatus comprising a programmable patterning device.

The computer system can also be configured to determine, for each point along the scan path in the Y-direction, a minimization of the residual distortions in the X-direction and the Y-direction, wherein the minimization is effectuated by an adjustment of at least one lens parameter and/or at least one scan parameter.

Furthermore, the computer system can be configured to provide during exposure of the second pattern in a scan, for each point along the scan path, the determined minimization of the residual distortions in the X-direction and the Y-direction by carrying out the adjustment of at least one lens parameter and/or at least one scan parameter.

The dynamic adjustments during the scan relating to the lens parameters can be effectuated by controlling the settings of the projecting system PS. The dynamic adjustments during the scan relating to the scan parameters, alternatively or additionally, can be effectuated by controlling the position of the mask table MT and/or the position of the substrate table WT. The adjustments of the lens parameters and the scan parameters are controlled by the computer system for each point along the scan path in the Y-direction.

It will be appreciated that although above embodiments may have been described in as applying intra-field correction during the illumination of the second pattern PT2, the present invention may also be applied by applying intra-field correction during creating first pattern PT1 already to improve overlay between first pattern PT1 and second pattern PT2. Alternatively, in an embodiment overlay correction for overlay between those two patterns is obtained by correcting during creating both the first pattern PT1 and the second pattern PT2.

It also will be appreciated that the present invention relates to determining values for process parameters (such as scan parameters and lens parameters) of a process. The invention is not restricted to superimposing determined values for correcting values of parameters that would also be used without applying the invention. In stead, the invention encompasses determining values of process parameters that replace parameters of process parameters that would be used without applying the invention, for instance in case of non-linear parameters.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A method, comprising:
    determining an overlay error, caused by local residual distortion in a patterning device, between a first part of a first pattern associated with the patterning device and a first part of a second pattern associated with the patterning device, the first and second patterns overlapping and the overlay error corresponding to forming the first and second patterns according to a suggested value for each of at least one process parameter determined based on an overlay correction model, wherein the at least one process parameter includes at least one of a lens parameter and a scan parameter;
    determining a value for the each of the at least one process parameter corresponding to a minimal overlay error between a second part of the first pattern and a second part of the second pattern by fitting the overlay correction model to data comprising the overlay error and the suggested value for the each of the at least one process parameter; and
    creating at least one of the second part of the first pattern and the second part of the second pattern according to the determined value for the each of the at least one process parameter.

2. The method according to claim 1, wherein determining the overlay error comprises estimating the overlay error based on data relating to the creation of only one of the first and second patterns.

3. The method according to claim 1, wherein determining the overlay error comprises measuring the overlay error on a substrate processed according to the suggested value for the each of the at least one process parameter.

4. The method according to claim 1, wherein the second pattern is created on the substrate earlier than the first pattern.

5. The method according to claim 1, wherein the process is a lithographic process.

6. The method according to claim 5, further comprising:
    patterning a radiation beam using the patterning device, and
    creating the first part and the second part of at least one of the first and second patterns by illuminating a target portion by the patterned radiation beam.

7. The method according to claim 6, further comprising:
    estimating the overlay error using measurements of features of the patterning device.

8. The method according to claim 6, further comprising:
    scanning the patterning device with respect to a projection system;
    creating a first image of a first section of the patterning device at a first moment in time, the image being created in a slit;
    creating a second image of a second section of the patterning device at a second moment in time, the image being created in the slit and wherein the second moment differs from the first moment and wherein the first section of the patterning device differs from the second section of the patterning device; and
    scanning the target portion with respect to the slit thereby illuminating a first section of the target portion with the first image and illuminating a second section of the target portion with the second image;
    whereby the first image and the second image are shrunk with respect to the first section and the second section respectively of the patterning device with an image demagnification factor.

9. The method according to claim 8, wherein the at least one process parameter comprises the image demagnification factor.

10. The method according to claim 8, wherein the at least one process parameter comprises information corresponding to a third order aberration of the projection system.

11. The method according to claim 8, wherein the patterning device is scanned with respect to the projection system and wherein the target portion and the slit are scanned with respect to each other according to at least one scan parameter comprising trajectory and velocity and wherein the at least one process parameter corresponds to one of the at least one scan parameter.

12. The method according to claim 11, wherein the one of the at least one scan parameter comprises information corresponding to a velocity of the target portion with respect to the slit or corresponds to a velocity of the patterning device with respect to the projection system.

13. The method according to claim 11, wherein the patterning device is scanned with respect to the projection system in a first direction and the target portion is scanned with respect to the slit in a second direction;
    wherein the one of the at least one scan parameter corresponds to a component of the second direction.

14. The method according to claim 11, wherein the one of the at least one scan parameter corresponds to the rotation of the patterning device with respect to the target portion.

15. An apparatus configured to determine a value of a process parameter of a process for creating overlapping patterns on a substrate comprising:

a processor configured to fit an overlay correction model of the process to data comprising a suggested value of the process parameter determined based on the overlay correction model and an estimated overlay error, caused local residual distortion in a patterning device, between a first part of a first pattern associated with the patterning device and a first part of a second pattern associated with the patterning device, wherein the process parameter includes at least one of a lens parameter and a scan parameter, wherein the estimated overlay error corresponds to control of the process according to the suggested value of the process parameter, whereby the determined value of the process parameter corresponds to minimal overlay error between a second part of the first pattern and a second part of the second pattern;

the processor further being configured, based on the fitting, to determine a value of the process parameter for creating the first part of at least one of the first and second patterns in a section of a target portion and a second value of the process parameter for creating a second part of the at least one of the first and second patterns, wherein the first value differs from the second value.

16. The apparatus according to claim 15, wherein the processor is further arranged to estimate the overlay error using a measurement of a second overlay error on a second substrate processed according to the suggested value of the process parameter.

17. The apparatus according to claim 16, wherein the apparatus further comprises metrology devices configured to perform the measurements of the overlay error.

18. The apparatus according to claim 15, for use in the process comprising patterning a radiation beam with the patterning device and creating the first part and the second part of the at least one of the first and second patterns on the target portion using the patterned radiation beam, wherein the processor is further configured to estimate the overlay error using measurements of features of the patterning device.

19. The apparatus according to claim 15 for use in the process comprising patterning a radiation beam with the patterning device and creating the first part and the second part of the at least one of the first and second patterns on the target portion using the patterned radiation beam, wherein the processor is further arranged to estimate the overlay error using information on the creation of the patterning device.

20. An apparatus for creating a first pattern of several overlapping patterns on a substrate comprising:

a substrate table to hold the substrate;

a patterning device configured to create a first part of the first pattern in a first section of a target field and to create a second part of the first pattern in a second section of the target field, wherein the first part differs from the second part and the first section differs from the second section;

a controller connected to the patterning device and the substrate table and configured to control the overlay between the first pattern and a second pattern of the several overlapping patterns by controlling the substrate table and the patterning device based on values of a group of process parameters, wherein the controller is further configured to determine an overlay error, caused local residual distortion in the patterning device, between a third part of the first pattern and a part of the second pattern, the overlay error corresponding to forming the first and second patterns according to a suggested value for each of the group of process parameters determined based on an overlay correction model, wherein the apparatus is configured and arranged to create the first part according to a first value of a first process parameter of the group of process parameters and to create the second part according to a second value of the first process parameter, wherein the first process parameter includes at least one of a lens parameter and a scan parameter and wherein the first and second values of the first process parameter are determined by fitting the overlay correction model to data comprising the overlay error and the suggested values for each of the group of process parameters.

21. The apparatus according to claim 20, further comprising:

a projection system configured to image the patterning device supported by the apparatus wherein the image is smaller than the patterning device by an image demagnification factor; and a projection system control configured to control the demagnification factor based on the first and second values of the first process parameter.

* * * * *

UNITED STATES PATENT AND TRADEMARK OFFICE
CERTIFICATE OF CORRECTION

PATENT NO. : 8,248,579 B2
APPLICATION NO. : 11/948801
DATED : August 21, 2012
INVENTOR(S) : Everhardus Cornelis Mos Page 1 of 1

It is certified that error appears in the above-identified patent and that said Letters Patent is hereby corrected as shown below:

In the claims:

In col. 13, claim 15, line 4, after "caused" please insert --by--

In col. 14, claim 21, line 17, after "caused" please insert --by--

Signed and Sealed this
Seventh Day of May, 2013

Teresa Stanek Rea
*Acting Director of the United States Patent and Trademark Office*